US011740543B1

(12) United States Patent
Xu

(10) Patent No.: US 11,740,543 B1
(45) Date of Patent: Aug. 29, 2023

(54) PROJECTION APPARATUS

(71) Applicant: Longcai Xu, Shenzhen (CN)

(72) Inventor: Longcai Xu, Shenzhen (CN)

(73) Assignee: Longcai Xu, Shenzhen (CN)

( * ) Notice: Subject to any disclaimer, the term of this patent is extended or adjusted under 35 U.S.C. 154(b) by 0 days.

(21) Appl. No.: 18/165,946

(22) Filed: Feb. 8, 2023

(30) Foreign Application Priority Data

Dec. 29, 2022 (CN) ......................... 202223600085.6

(51) Int. Cl.
*G03B 21/14* (2006.01)
*G03B 21/20* (2006.01)
*H05K 7/20* (2006.01)
*G02B 5/18* (2006.01)
*G03B 21/16* (2006.01)

(52) U.S. Cl.
CPC ......... *G03B 21/145* (2013.01); *G02B 5/1866* (2013.01); *G03B 21/16* (2013.01); *G03B 21/2013* (2013.01); *H05K 7/2039* (2013.01)

(58) Field of Classification Search
CPC .. G03B 21/145; G03B 21/16; G03B 21/2013; G02B 5/1866; H05K 7/2039
See application file for complete search history.

(56) References Cited

U.S. PATENT DOCUMENTS 9,395,608 B2 * 7/2016 Zhang ................ G03B 21/2033
2006/0274534 A1 * 12/2006 Chang .................. G03B 21/145 362/362
2016/0026073 A1 * 1/2016 Zhang ................ G03B 21/2033 353/101

FOREIGN PATENT DOCUMENTS

CN 207037318 U 2/2018
CN 212433564 U 1/2021
CN 217213972 U 8/2022

* cited by examiner

*Primary Examiner* — Bao-Luan Q Le
(74) *Attorney, Agent, or Firm* — Nitin Kaushik

(57) ABSTRACT

The present invention discloses a projection apparatus, including: a housing including a light transmission groove and a limit wall arranged around the light transmission groove, where a width of a limit groove defined by the limit wall is greater than a width of the light transmission groove; and a first light source assembly being received in the housing and including a first light source body and a diffractive optical element located above the first light source body, where the diffractive optical element is mounted in the limit groove, and the limit wall limits excessive shift of the diffractive optical element along a horizontal direction, which facilitates mounting of the diffractive optical element.

20 Claims, 22 Drawing Sheets

54
115
114
11
112
113

4

PROJECTION APPARATUS

CROSS-REFERENCE TO RELATED APPLICATIONS

The application claims priority to Chinese patent application No. 202223600085.6, filed on Dec. 29, 2022, the entire contents of which are incorporated herein by reference.

TECHNICAL FIELD

The present invention relates to the technical field of projection apparatuses, in particular to a projection apparatus convenient for positioning a light source assembly.

BACKGROUND

An existing projection apparatus includes a housing, and a first lamp body assembly and a second lamp body assembly mounted on the housing. The housing includes an upper housing and a lower housing matched with each other and a receiving cavity formed between the upper housing and the lower housing. The upper housing includes a first projection groove and a second projection groove that penetrate through a top surface of the upper housing. The first lamp body assembly is arranged corresponding to the first projection groove, and the second lamp body assembly is arranged corresponding to the second projection groove. The first lamp body assembly includes a first lamp body and a diffractive optical element located above the first lamp body. The first lamp body upwardly contacts with the diffractive optical element. The diffractive optical element is upwardly exposed to the first projection groove.

Due to a smaller structure of the diffractive optical element, when being aligned with the first projection groove for mounting, the diffractive optical element is horizontally misaligned or drops, which increases the time cost; and in addition, when the first lamp body assembly is disassembled, the diffractive optical element is easy to lose, resulting in loss of a projection function of the first lamp body assembly, which cannot meet the requirements of users.

SUMMARY

In view of the problems faced in the background, the present invention provides a projection apparatus convenient for positioning of a diffractive optical element.

To achieve the above objective, the present invention adopts the following technical means:

Compared to the prior art, the projection apparatus according to the present invention has the following beneficial effects:

The housing includes the light transmission groove and the limit wall arranged around the light transmission groove, where the width of the limit groove defined by the limit wall is greater than the width of the light transmission groove; and the first light source assembly is received in the housing and includes the first light source body and the diffractive optical element located above the first light source body, where the diffractive optical element is mounted in the limit groove, and the limit wall limits excessive shift of the diffractive optical element along the horizontal direction, which facilitates mounting of the diffractive optical element and prevents the situation that the product cannot present the projection effect of the first light source assembly due to loss of the diffractive optical element in maintenance.

DESCRIPTION OF REFERENCE NUMBERS OF SPECIFIC EMBODIMENT

Figure 1:
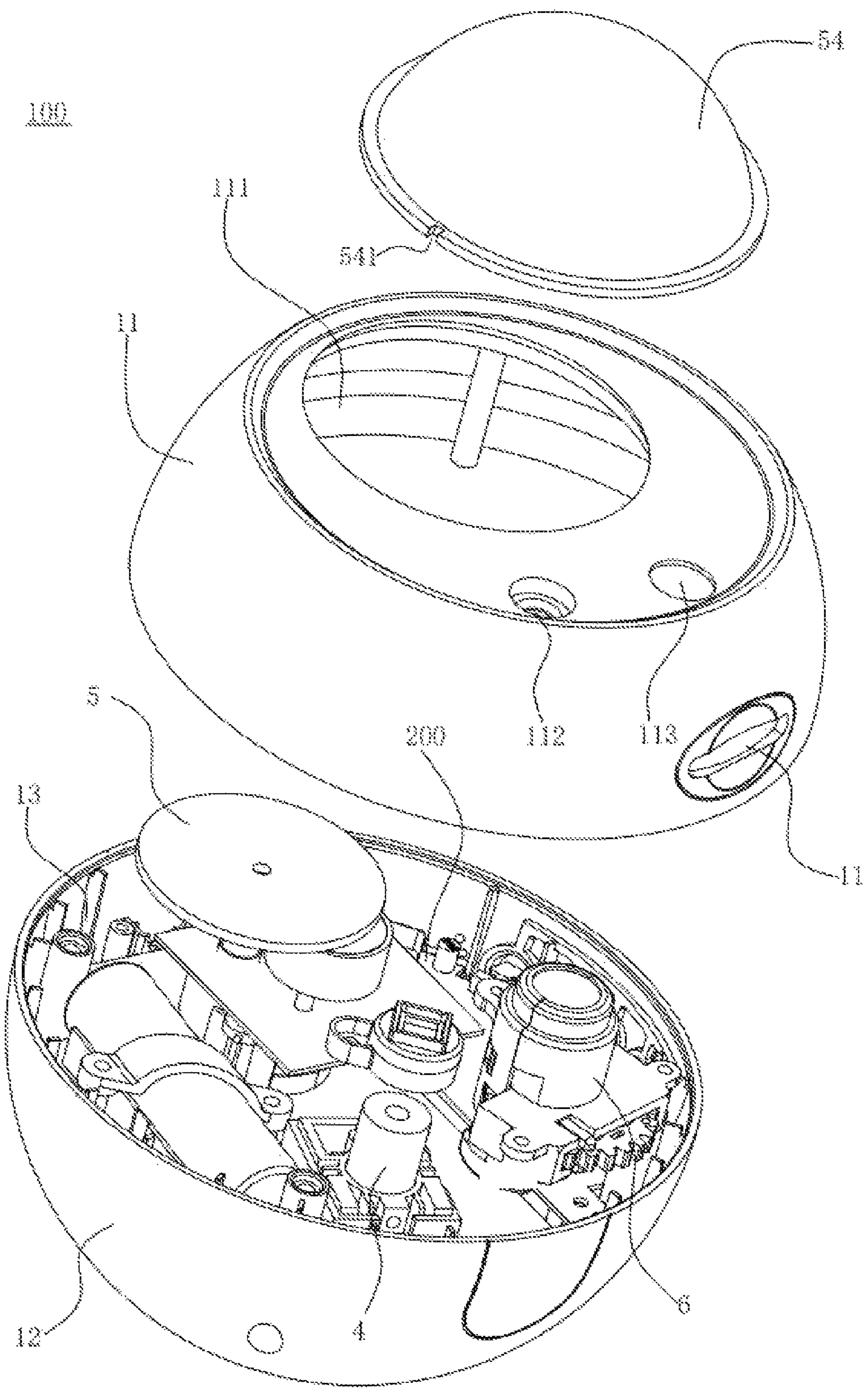
FIG. 1 is a three-dimensional view of a projection apparatus according to a first embodiment of the present invention.

| | | | |
|---|---|---|---|
| projection apparatus 100 | housing 1 | upper housing 11 | projection groove 111 |
| light transmission groove 112 | projection port 113 | limit wall 114 | limit groove 115 |
| slot 116 | lower housing 12 | cavity 13 | base 2 |

-continued

| | | | |
|---|---|---|---|
| fixing column 21 | limit block 211 | light transmission hole 22 | limit portion 23 |
| support column 24 | fixing groove 25 | receding groove 26 | crimping portion 27 |
| crimping hole 271 | receiving space 28 | positioning column 29 | shaft portion 30 |
| motor assembly 3 | fixing lug 31 | first light source assembly 4 | heat sink 41 |
| mounting groove 411 | fixing hole 412 | first light source body 42 | fixing element 43 |
| through hole 431 | diffractive optical element 44 | second light source assembly 5 | second light source body 51 |
| optical interference plate 52 | gear ring portion 53 | rotary shaft portion 531 | flange 532 |
| condenser lens 54 | clamping groove 541 | third light source assembly 6 | fixing frame 61 |
| receiving groove 611 | lamp plate 62 | projection disc 63 | convex lens 64 |
| limit plate 7 | light outlet 71 | conductive slip ring assembly 8 | rotor 81 |
| first wire 82 | stator 83 | second wire 8484 | gear ring member 9 |
| mounting hole 91 | rotary portion 92 | gear teeth portion 93 | conductive disc 10 |
| conductive chute 101 | spring needle module 20 | mainboard 200 | |

DESCRIPTION OF THE EMBODIMENTS

For the convenience of better understanding the objective, structure, features and effects of the present invention, the present invention is further described in combination with accompanying drawings and specific embodiments.

As shown in FIG. 1 to FIG. 6, each of which is a first embodiment of the present invention, the projection apparatus 100 includes a housing 1, a base 2 mounted in the housing 1, a motor assembly 3, a first light source assembly 4, a second light source assembly 5, and a third light source assembly 6.

Figure 2:
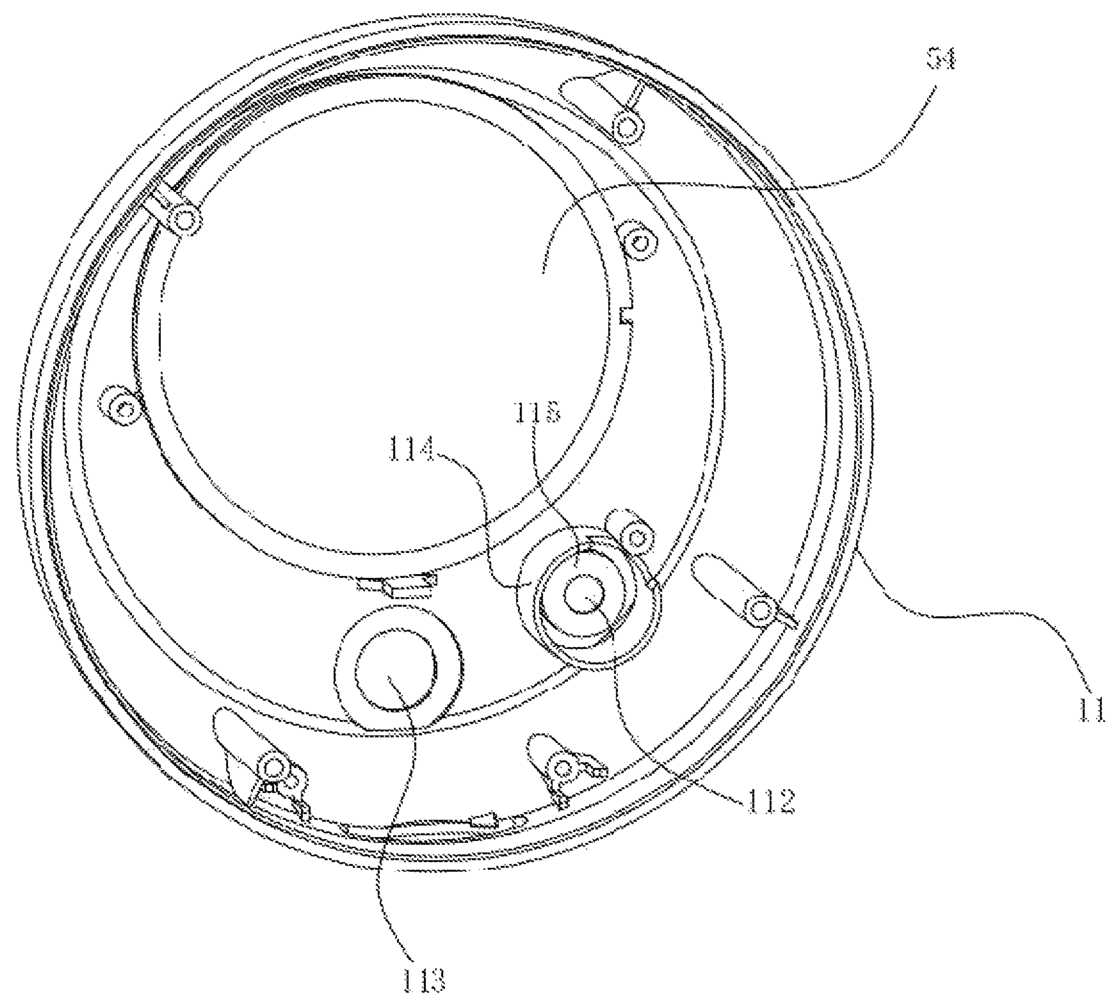
FIG. 2 is a three-dimensional diagram of an upper housing in FIG. 1.

As shown in FIG. 1 and FIG. 2, the housing 1 includes an upper housing 11 and a lower housing 12 matched with each other, and a cavity 13 formed between the upper housing 11 and the lower housing 12. The upper housing 11 includes a projection groove 111 penetrating through a top surface thereof, a light transmission groove 112, and a projection port 113. Widths of the light transmission groove 112, the projection port 113, and the projection groove 111 in a horizontal direction increase in sequence. The upper housing 11 further includes a limit wall 114 arranged around the light transmission groove 112, where the limit wall 114 protrudes downward into the cavity 13, the limit wall 114 surrounds a limit groove 115, and a width of the limit groove 115 in the horizontal direction is greater than a width of the light transmission groove 112 in the horizontal direction. The upper housing 11 further includes a slot 16 penetrating through a side wall thereof along the horizontal direction.

Figure 3:
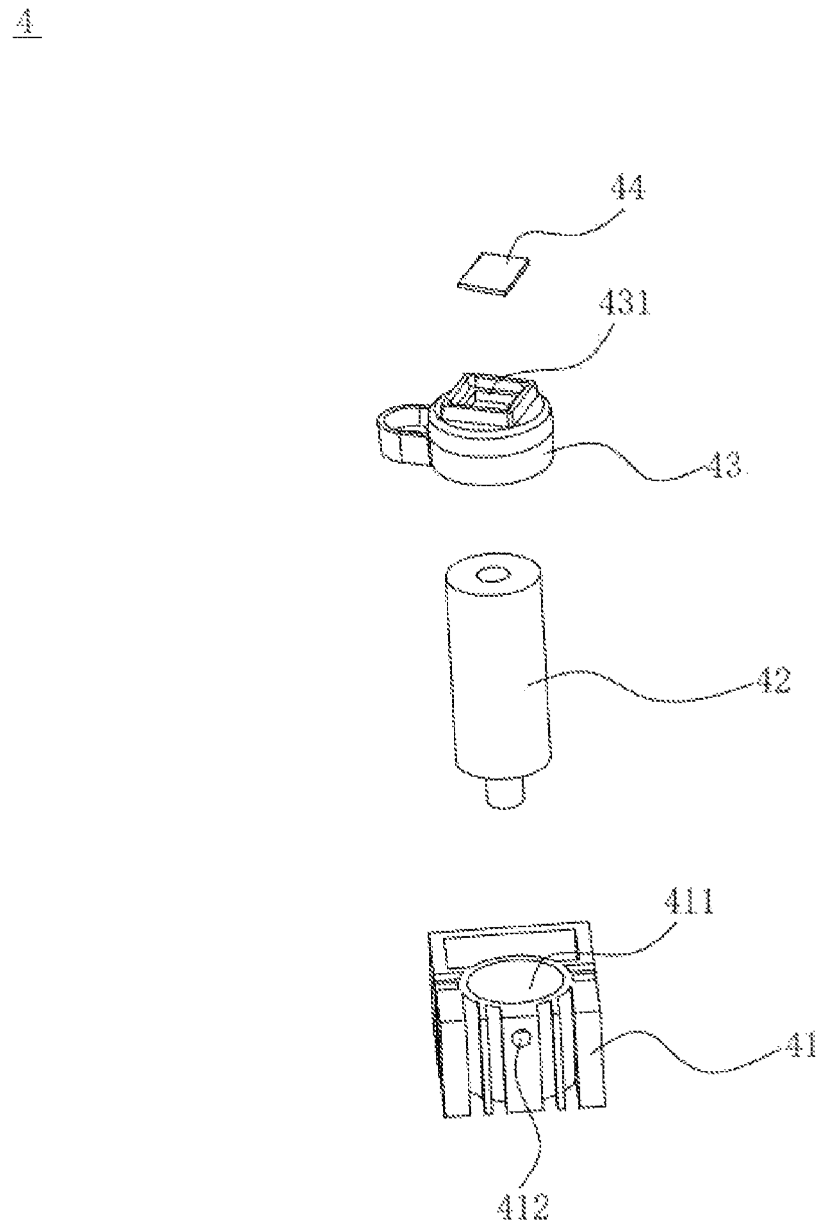
FIG. 3 is a three-dimensional exploded view of a first light source assembly in FIG. 1.

As shown in FIG. 3, the base 2 is mounted on the lower housing 12 and includes a plurality of fixing columns 21 formed by extending towards the upper housing 11, the two adjacent fixing columns 21 are spaced from each other, and each fixing column 21 includes a plurality of limit blocks 211 spaced. The motor assembly 3 is fixed to the base 2 and includes fixing lugs 31 located on left and right sides thereof. Each fixing lug 31 is fixed to one of the fixing columns, that is, the two fixing columns 21 are located on the left and right sides of the motor assembly 3, respectively, and the plurality of limit blocks 211 are arranged around one of the fixing lugs 31.

As shown in FIG. 3, the first light source assembly 4 is arranged corresponding to the light transmission groove 112 and includes a heat sink 41, a first light source body 42 mounted on the heat sink 41, a diffractive optical element 44 located above the first light source body 42, and a fixing element 43. The heat sink 41 includes a mounting groove 411 penetrating through upper and lower surfaces thereof and a fixing hole 412 in communication with the mounting groove 411. The fixing hole 412 penetrates through a side wall of the heat sink 41. The mounting groove 411 and the fixing hole 412 are perpendicular to each other. The first light source body 42 is mounted in the mounting groove 411 and protrudes into the fixing hole 412 via a locking fastener, to fix the first light source body 42 to the heat sink 41. The first light source body 42 is capable of protruding upward into the limit groove 115 or is located below the limit groove 115. The diffractive optical element 44 is fixedly mounted in the limit groove 115. The limit wall 114 limits the diffractive optical element 44 to shift along the horizontal direction. The diffractive optical element 44 includes a plurality of light transmission microholes. The first light source body 42 emits a beam of light, the beam of light is diffracted by the plurality of light transmission microholes to form a plurality of light spots, and the plurality of light spots are scattered at intervals on a projection effect formed by the second light source assembly 5. The fixing element 43 is received in the limit groove 115, and the fixing element 43 is located between the diffractive optical element 44 and the first light source body 42. The fixing element 43 includes a through hole 431 in up-down communication with the light transmission groove 112. The diffractive optical element 44 is fixed to the fixing element 43 and located between the light transmission groove 112 and the fixing element 43. A downward protrusion height of the limit wall 114 is greater than twice a height of the diffractive optical element 44. Light emitted by the first light source body 42 sequentially passes through the limit groove 115, the through hole 431, and the light transmission groove 112. A circuit board of the first light source body 42 may be defined as a fixing plate, and a screw sequentially passes through the fixing plate, the fixing lugs 31 of the motor assembly 3, and the fixing columns 21.

Figure 4:
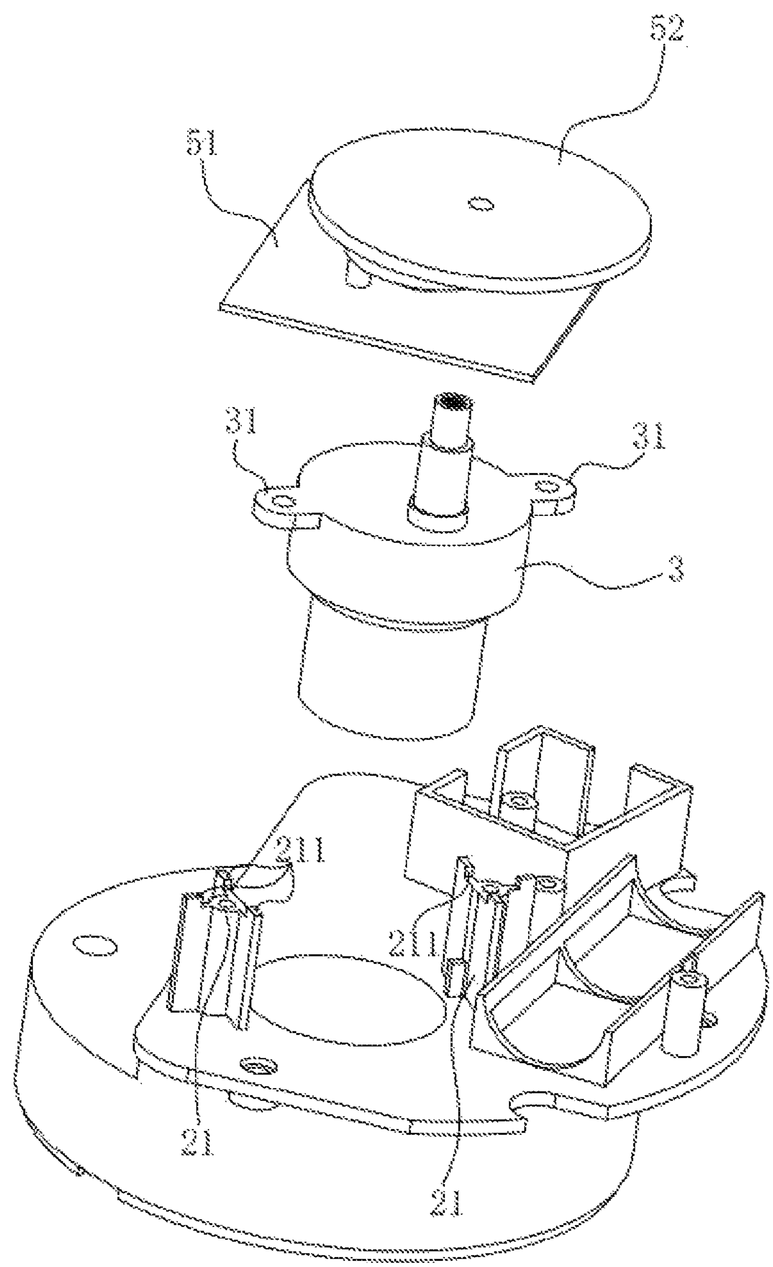
FIG. 4 is a three-dimensional exploded view of a third light source assembly in FIG. 1.

As shown in FIG. 4, the second light source assembly 5 is arranged corresponding to the projection groove 111 and includes a second light source body 51, an optical interference plate 52 located above the second light source body 51, and a condenser lens 54 mounted in the projection groove 111. The condenser lens 54 includes a clamping groove 541 formed by recessing from a side wall thereof. The upper housing 11 includes a positioning portion matched with the clamping groove 541, to avoid wrong mounting of the condenser lens 54.

Figure 5:
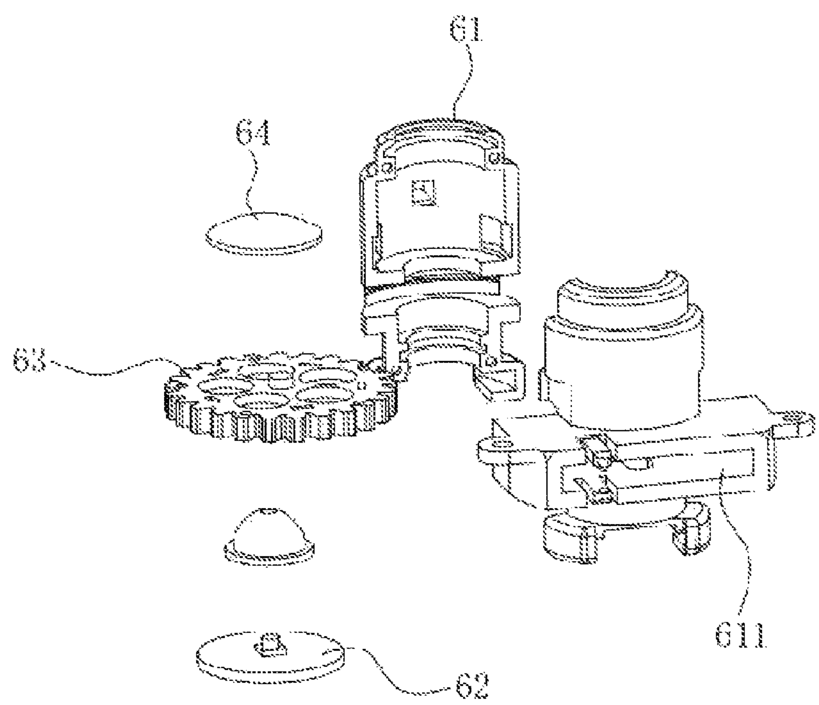
FIG. 5 is a three-dimensional exploded view of a base, a motor assembly, a second light source body, and an optical interference plate in FIG. 1.

As shown in FIG. 5, the third light source assembly 6 is located below the projection port 113 and includes a fixing frame 61, a lamp plate 62 mounted on the fixing frame 61, a projection disc 63 located above the lamp plate 62, and a convex lens 64 located above the projection disc 63. The fixing frame 61 is provided with a receiving groove 611 corresponding to the projection disc 63. The projection disc 63 may be movably inserted into and extracted from the slot 16. A portion of the projection disc 63 is exposed to the slot 16, which is convenient for a user to pull the projection disc 63 to implement replacement of projection patterns.

As shown in FIG. 6 to FIG. 12, each of which is a second embodiment of the present invention, the projection apparatus 100 includes a housing 1, a base 2 mounted on the housing 1, a motor assembly 3, a first light source assembly 4, a second light source assembly 5, a gear ring member 9, and a limit plate 7.

Figure 6:
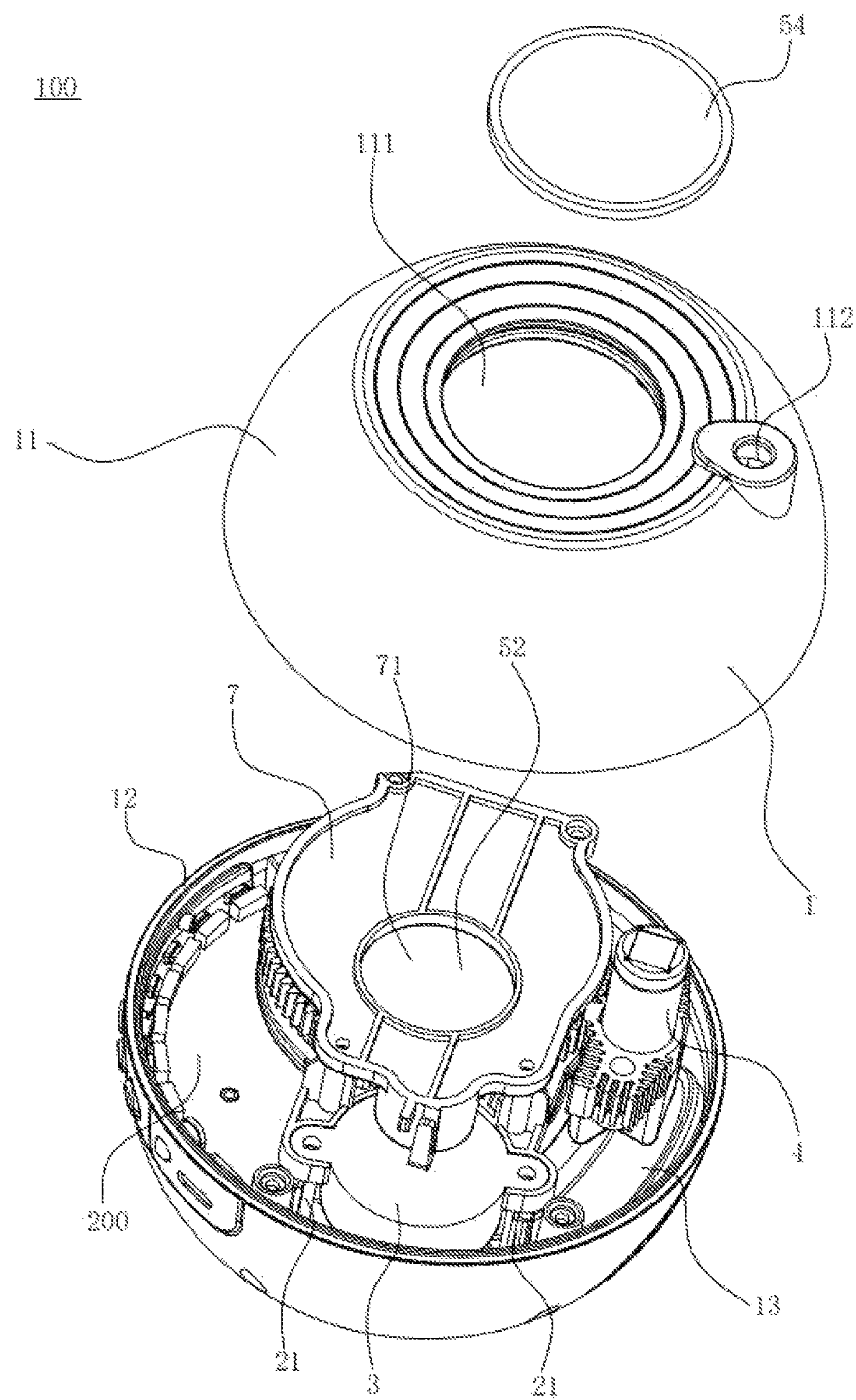
FIG. 6 is a three-dimensional view of a projection apparatus according to a second embodiment of the present invention.
Figure 7:
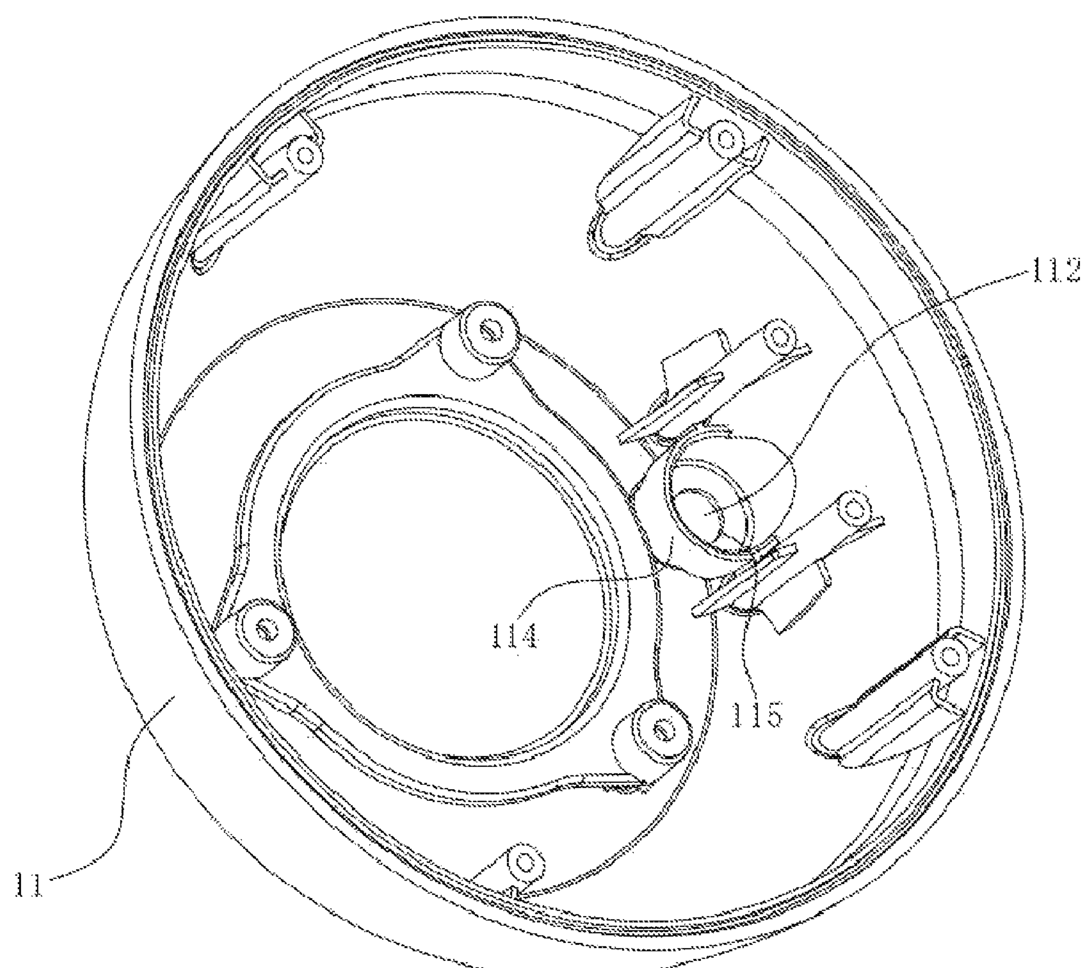
FIG. 7 is a three-dimensional diagram of an upper housing in FIG. 6.

As shown in FIG. 6 and FIG. 7, the housing 1 includes an upper housing 11 and a lower housing 12 matched with each other, and a cavity 13 formed between the upper housing 11 and the lower housing 12. The upper housing 11 includes a projection groove 111 penetrating through a top surface thereof and a light transmission groove 112. A width of the projection groove 111 in a horizontal direction is greater than a width of the light transmission groove 112 in the horizontal direction. The upper housing 11 further includes a limit wall 114 arranged around the light transmission groove 112, where the limit wall 114 protrudes downward into the cavity 13, the limit wall 114 surrounds a limit groove 115, and a width of the limit groove 115 in the horizontal direction is greater than a width of the light transmission groove 112 in the horizontal direction. In this embodiment, the plurality of fixing columns 21 are formed by extending upward from the lower housing 12.

Figure 8:
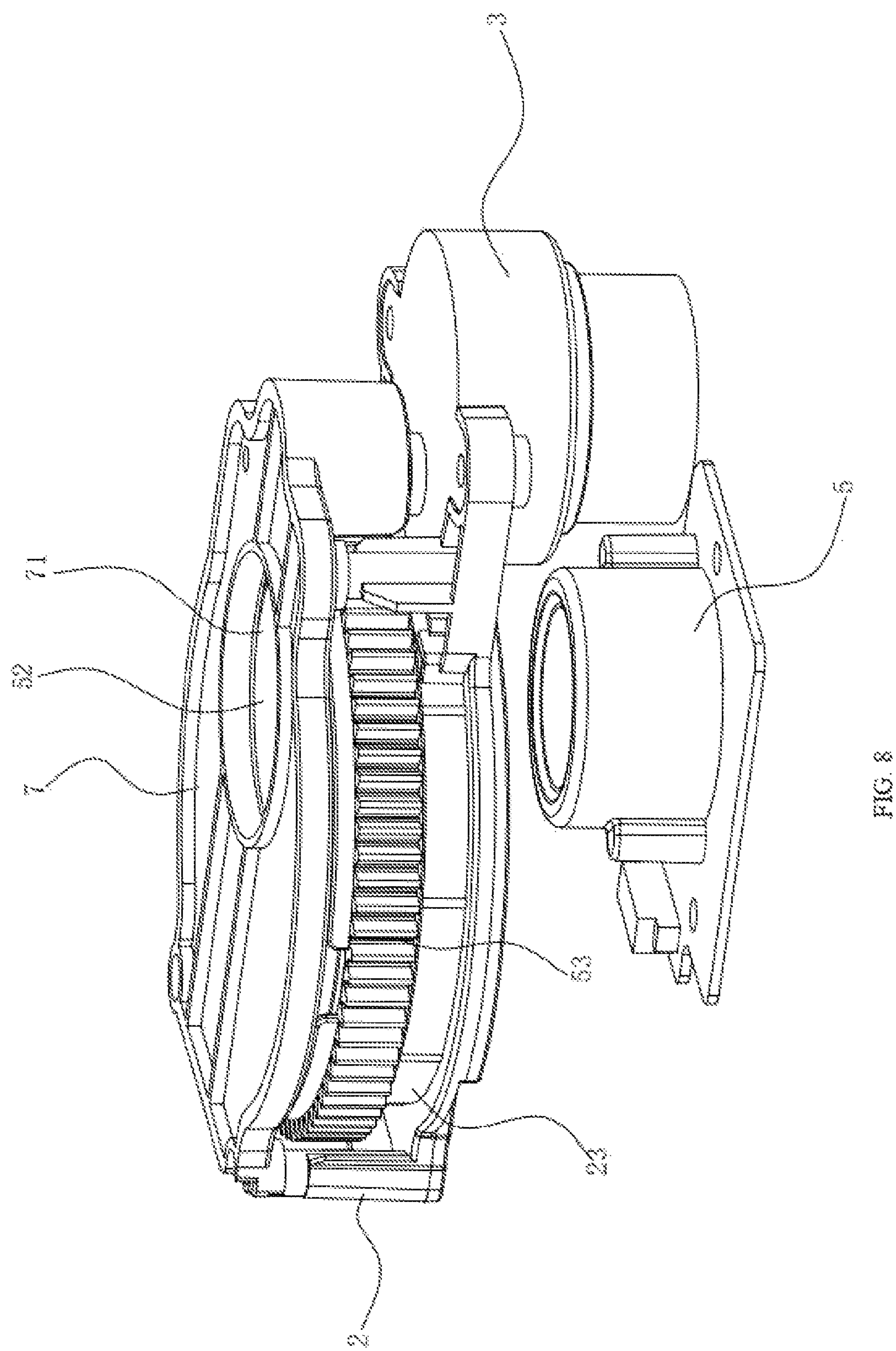
FIG. 8 is a three-dimensional view of removal of a housing, a condenser lens, and a first light source assembly in FIG. 6.
Figure 9:
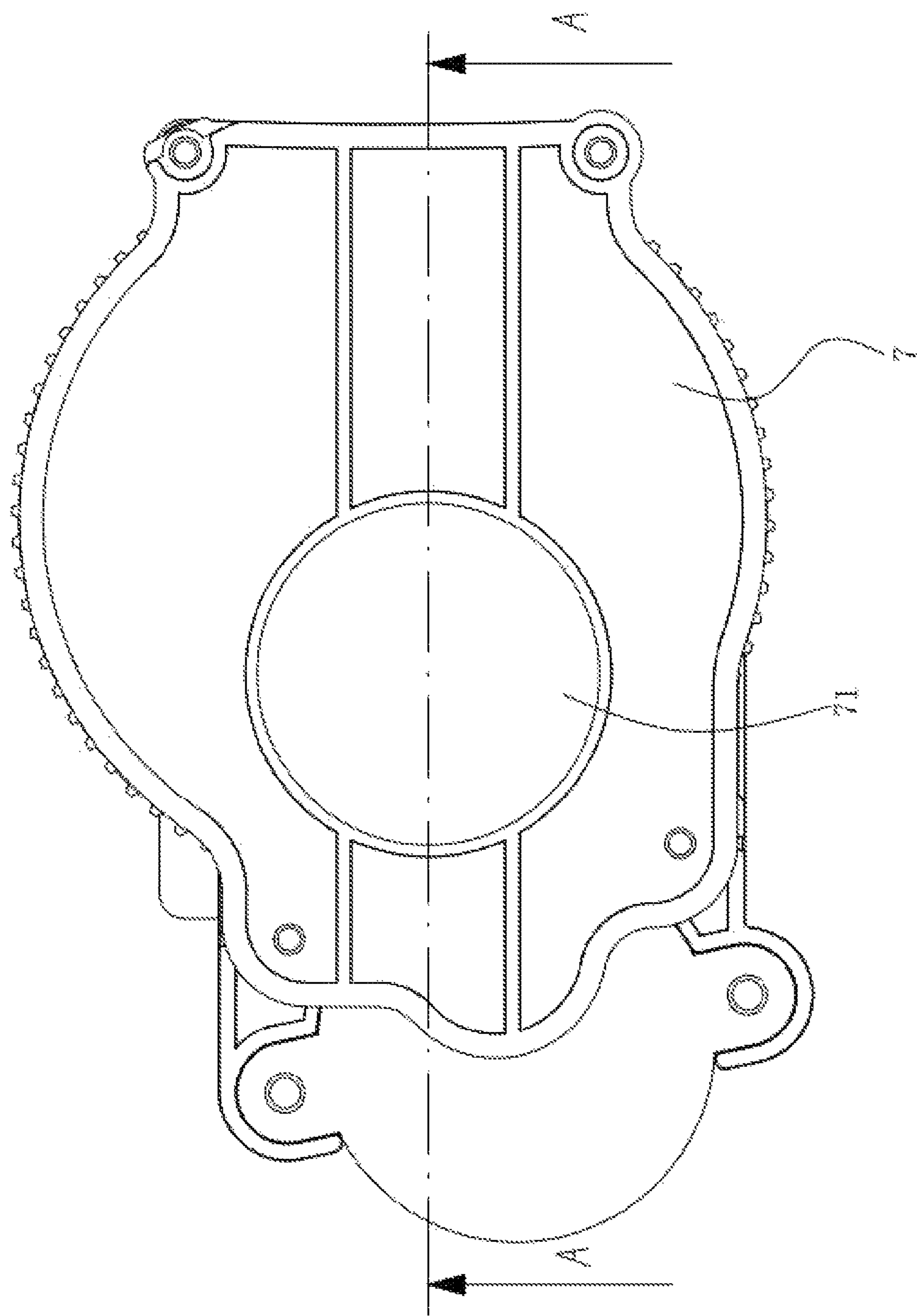
FIG. 9 is a top view of FIG. 8.
Figure 11:
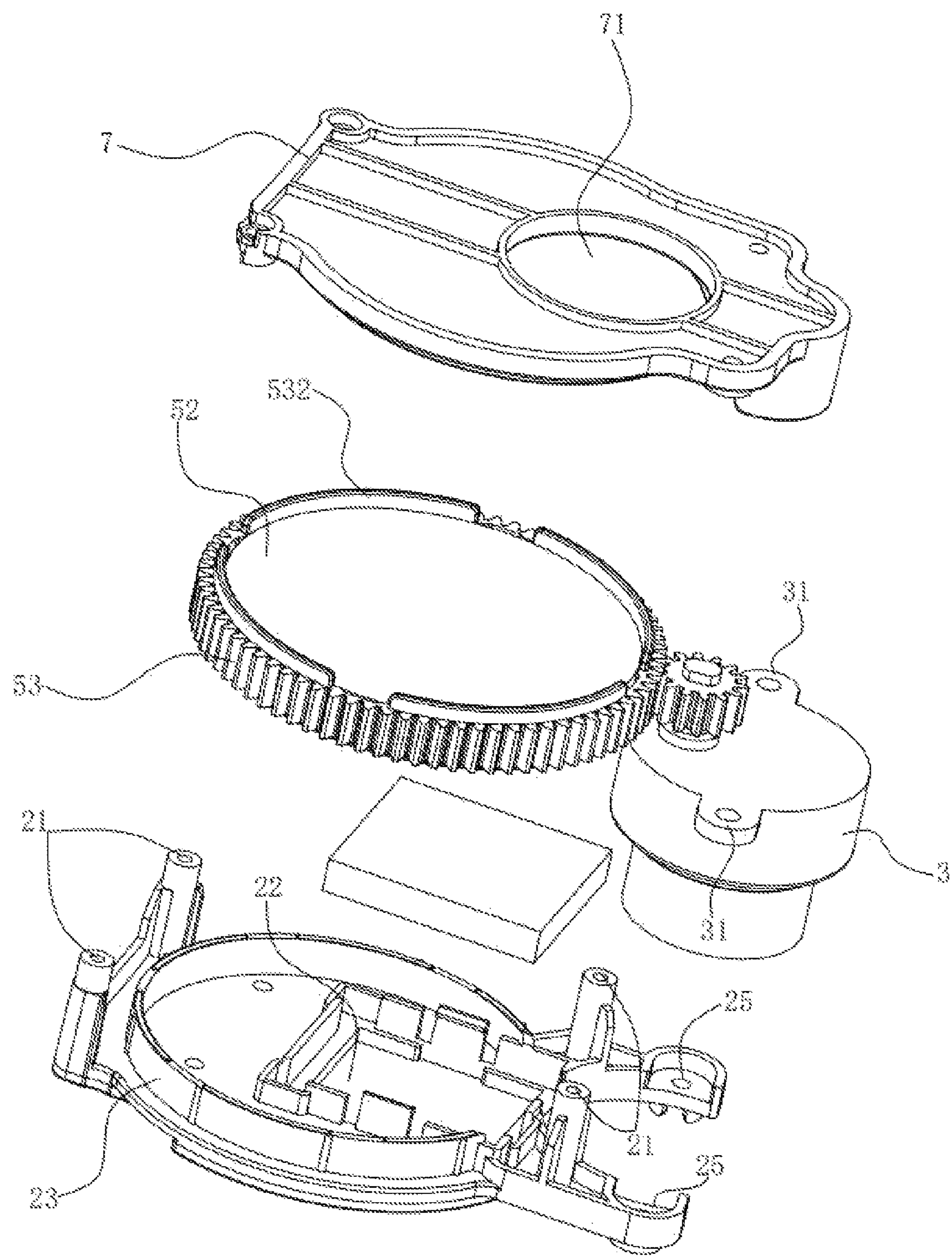
FIG. 11 is a three-dimensional exploded view of FIG. 8.

As shown in FIG. 8, FIG. 9, and FIG. 11, the base 2 includes a light transmission hole 22 penetrating through upper and lower surfaces thereof, a limit portion 23 arranged around the light transmission hole 22, a plurality of support columns 24 arranged around the limit portion 23, and a plurality of fixing grooves 25 located outside the support columns 24. The light transmission hole 22 is aligned with the projection groove 111 in an up-down manner. Each fixing groove 25 is arranged corresponding to one of the fixing columns 21. The motor assembly 3 includes fixing lugs 31 located on left and right sides thereof. Each fixing lug 31 is fixed to one of the fixing grooves 25. In this embodiment, the base 2 is defined as a fixing plate, and a screw sequentially passes through the fixing lugs 31, the fixing grooves 25, the fixing plate, and the fixing columns 21, to fix them to one another. The two fixing columns 21 are located on left and right sides of the motor.

Figure 12:
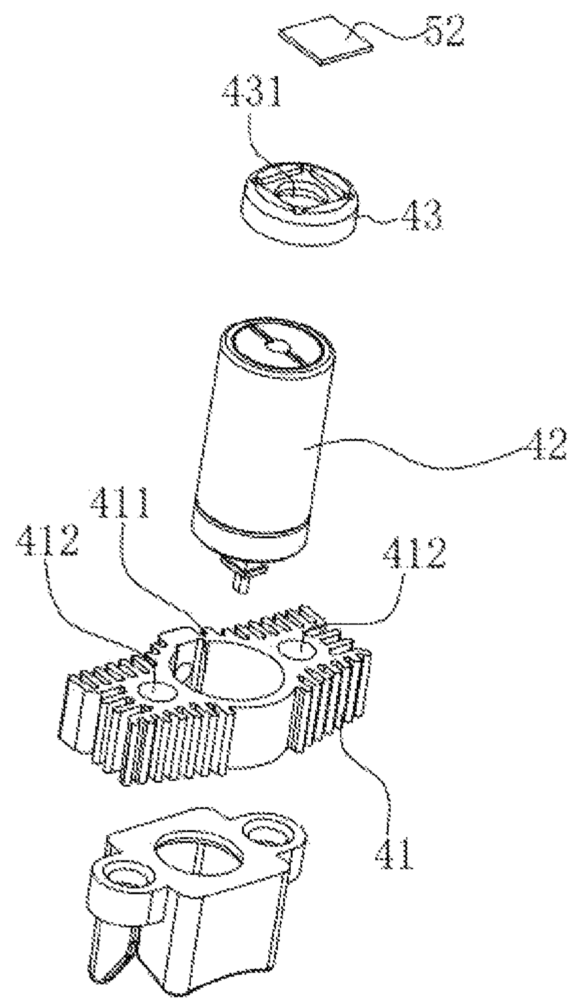
FIG. 12 is a three-dimensional exploded view of a first light source assembly in FIG. 6.

As shown in FIG. 12, the first light source assembly 4 is arranged corresponding to the light transmission groove 112 and includes a heat sink 41, a first light source body 42 mounted on the heat sink 41, a diffractive optical element 44 located above the first light source body 42, and a fixing element 43. The heat sink 41 includes a mounting groove 411 penetrating through upper and lower surfaces thereof and a plurality of fixing holes 412. The first light source body 42 is mounted in the mounting groove 411 and protrudes into the fixing holes 412 via a locking fastener, to fix the first light source body 42 to the heat sink 41. The first light source body 42 is capable of protruding upward into the limit groove 115 or is located below the limit groove 115. The diffractive optical element 44 is fixedly mounted in the limit groove 115. The limit wall 114 limits the diffractive optical element 44 to shift along the horizontal direction. The diffractive optical element 44 includes a plurality of light transmission microholes. The first light source body 42 emits a beam of light, the beam of light is diffracted by the plurality of light transmission microholes to form a plurality of light spots, and the plurality of light spots are scattered at intervals on a projection effect formed by the second light source assembly 5. The fixing element 43 is received in the limit groove 115, and the fixing element 43 is located between the diffractive optical element 44 and the first light source body 42. The fixing element 43 includes a through hole 431 in up-down communication with the light transmission groove 112. The diffractive optical element 44 is fixed to the fixing element 43 and located between the light transmission groove 112 and the fixing element 43. A downward protrusion height of the limit wall 114 is greater than twice a height of the diffractive optical element 44. Light emitted by the first light source body 42 sequentially passes through the limit groove 115, the through hole 431, and the light transmission groove 112.

Figure 10:
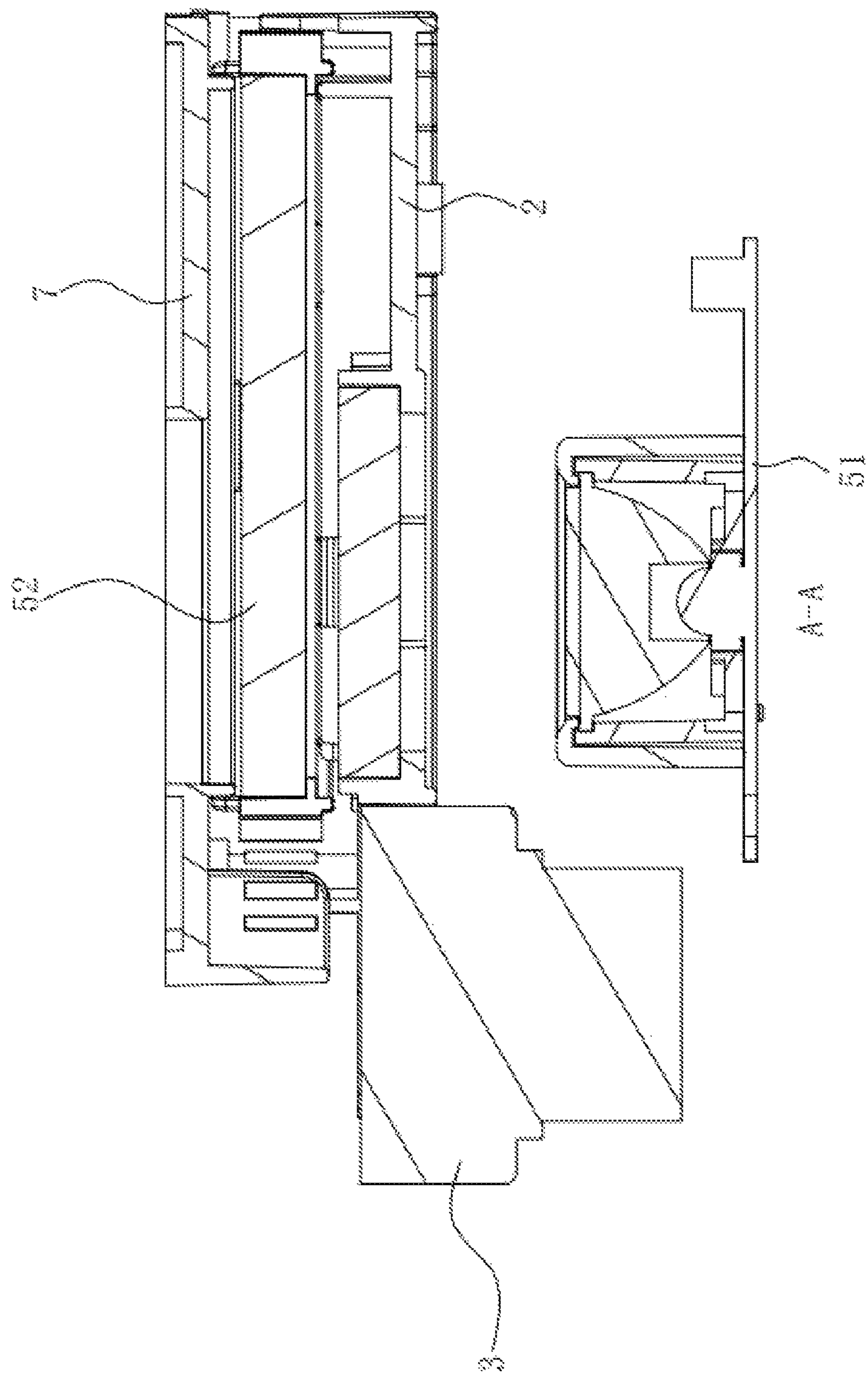
FIG. 10 is a sectional view of sectioning along a line A-A in FIG. 9.

As shown in FIG. 10 and FIG. 11, the second light source assembly 5 is arranged corresponding to the projection groove 111 and includes a second light source body 51, an optical interference plate 52 located above the second light source body 51, a gear ring portion 53 arranged around the optical interference plate 52, and a condenser lens 54 mounted in the projection groove 111. The optical interference plate 52 is arranged corresponding to the light transmission hole 22, and the optical interference plate 52 is fixed to the gear ring portion 53. The gear ring portion 53 includes a rotary shaft portion 531 that is arranged around the optical interference plate 52 and protrudes downward, and a flange 532 formed by extending upward. The rotary shaft portion 531 is arranged around the limit portion 23. The gear ring portion 53 is capable of rotating around the limit portion 23. The limit portion 23 limits excessive shift of the gear ring portion 53 along the horizontal direction. The condenser lens 54 includes a clamping groove 541 formed by recessing from a side wall thereof. The upper housing 11 includes a positioning portion matched with the clamping groove 541, to avoid wrong mounting of the condenser lens 54.

As shown in FIG. 10 and FIG. 11, the limit plate 7 is located above the gear ring portion 53 and is fixed to the plurality of support columns 24. The limit plate 7 includes a light outlet 71 fixed to upper and lower surfaces thereof. The optical interference plate 52 is upwardly exposed to the light outlet 71. The limit plate 7 is arranged around the flange 532, to limit excessive upward shift and horizontal shift of the gear ring portion 53.

Figure 13:
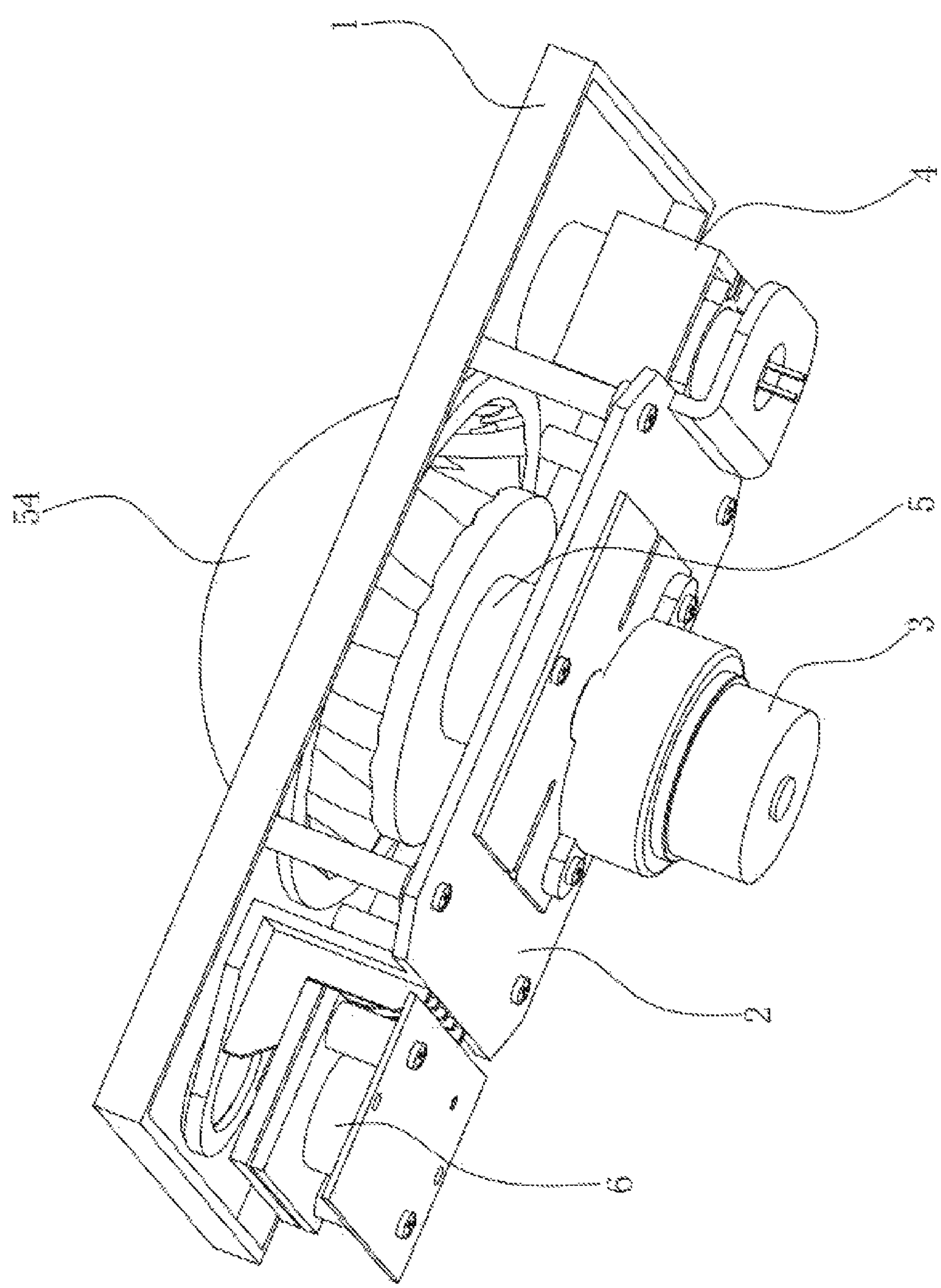
FIG. 13 is a schematic diagram of a projection apparatus according to a third embodiment of the present invention.
Figure 14:
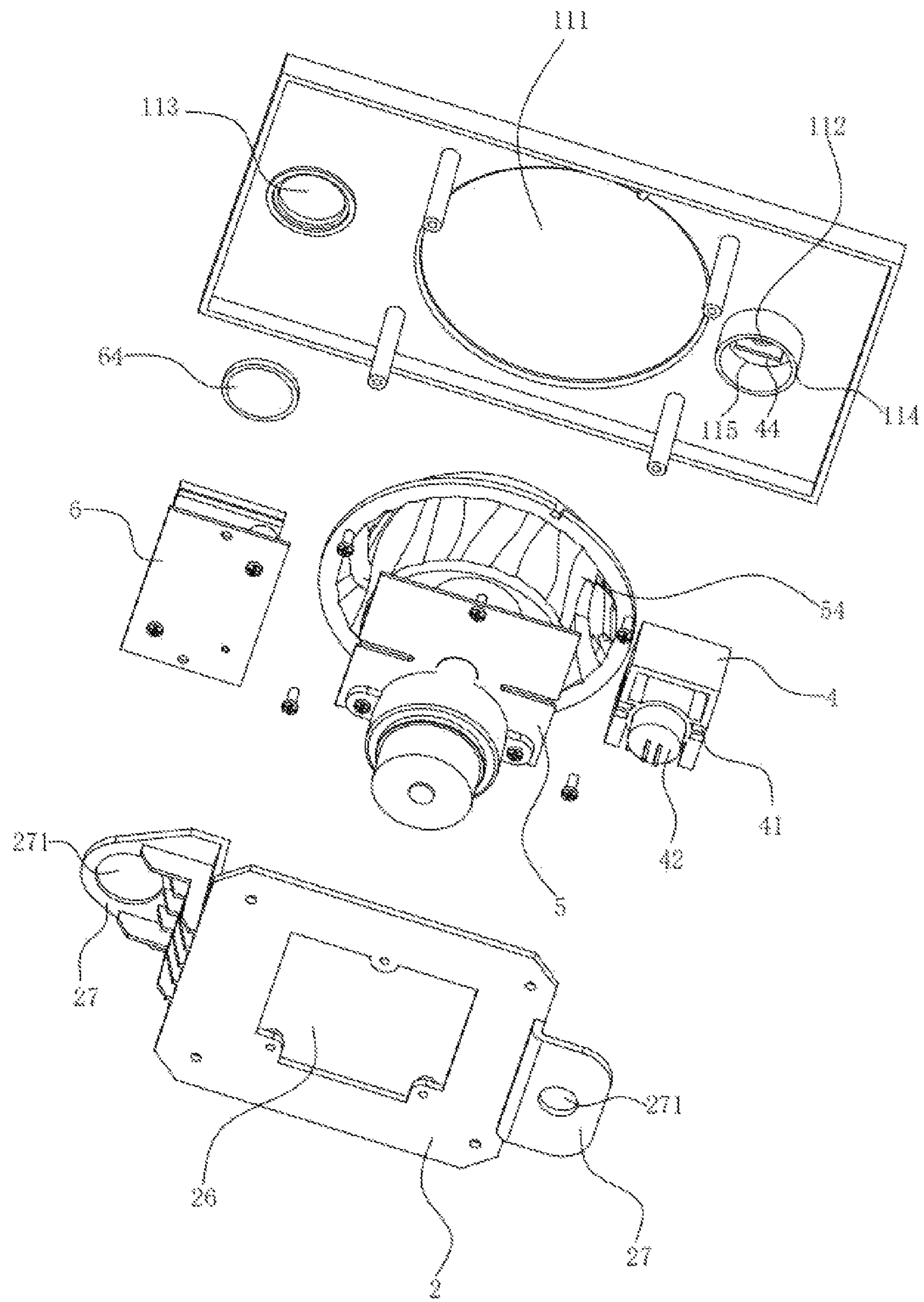
FIG. 14 is a three-dimensional exploded view of FIG. 13.
Figure 15:
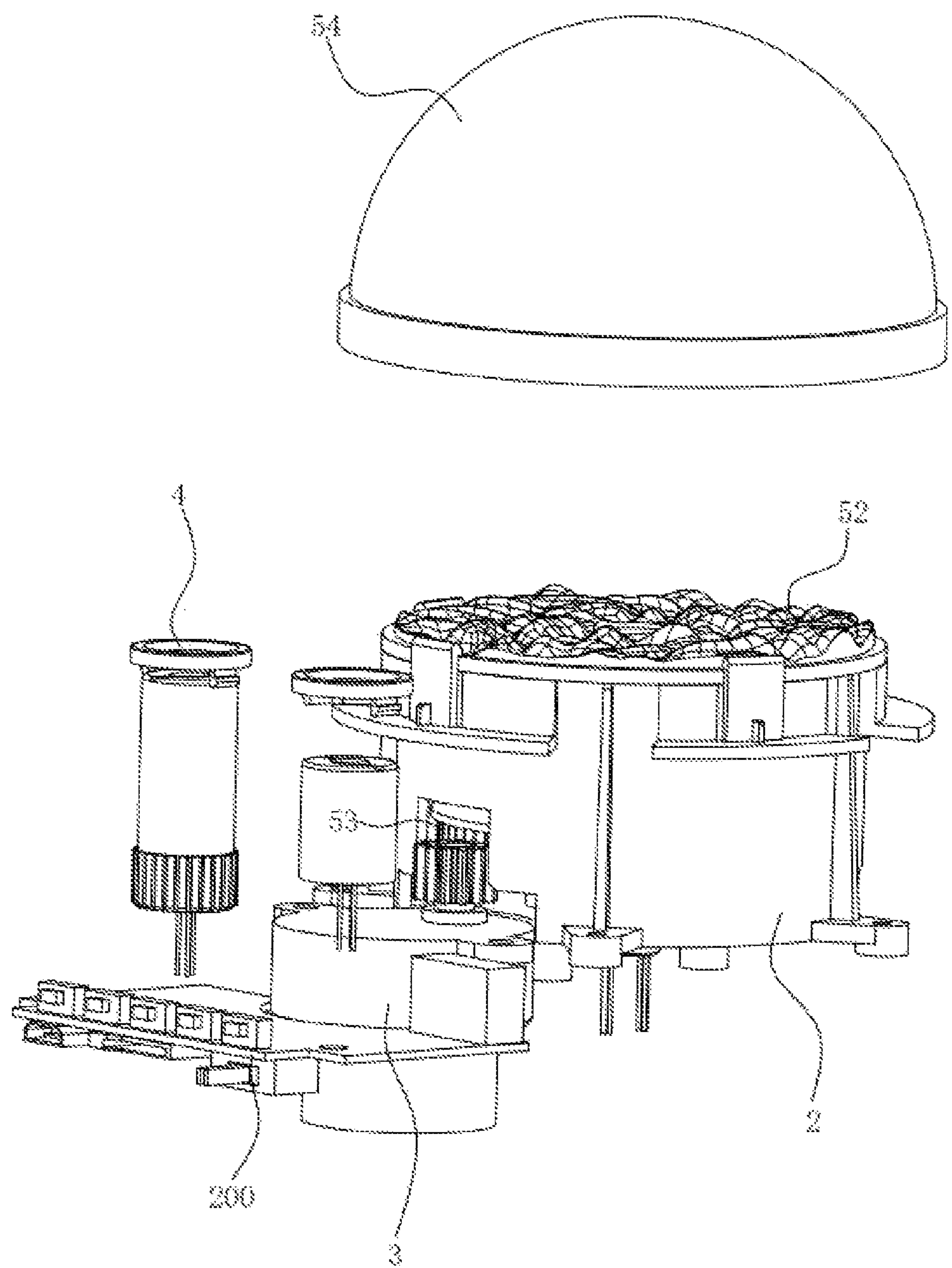
FIG. 15 is a three-dimensional view of a projection apparatus according to a fourth embodiment of the present invention.
Figure 16:
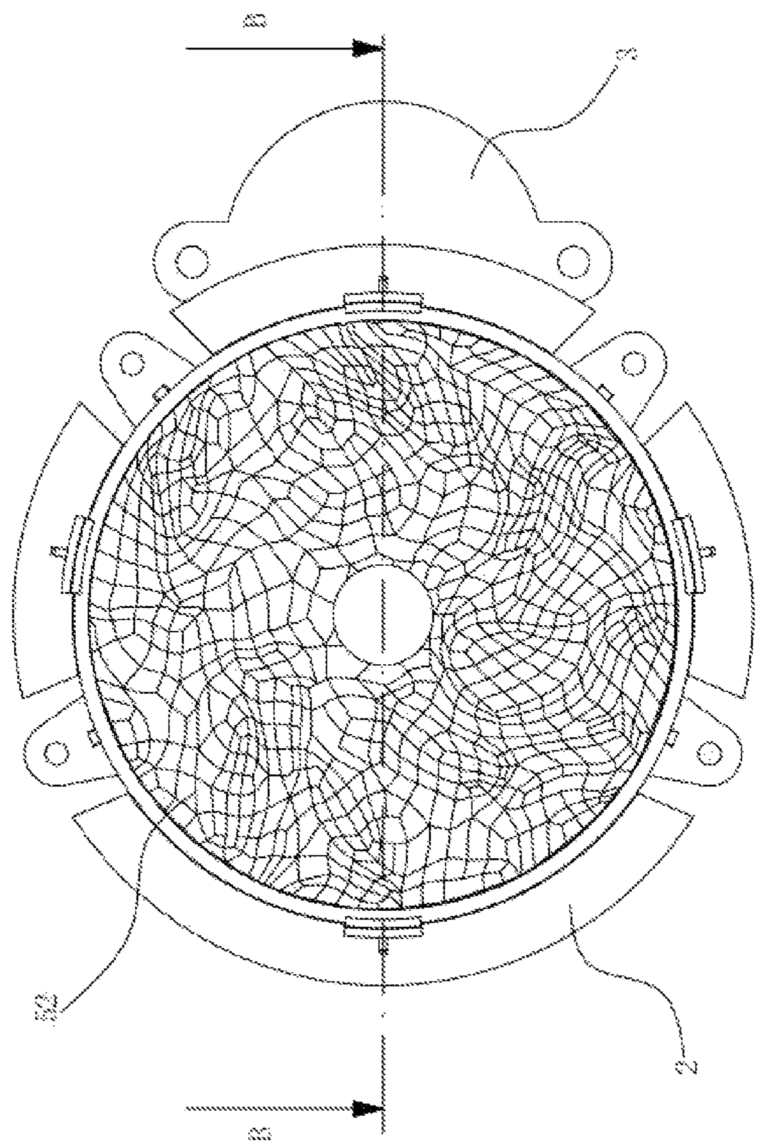
FIG. 16 is a top view of FIG. 15.
Figure 17:
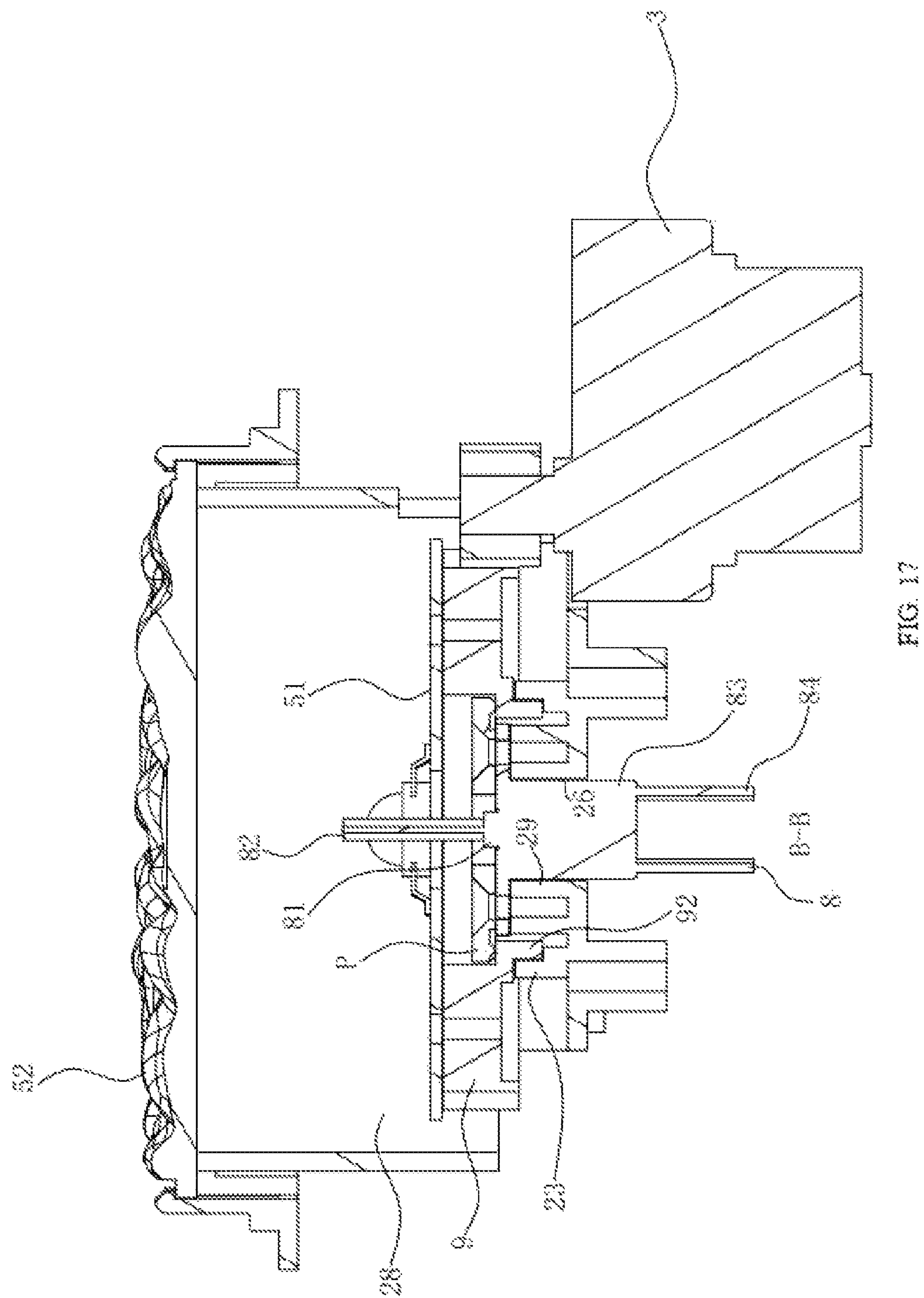
FIG. 17 is a sectional view of sectioning along a line B-B in FIG. 16.
Figure 18:
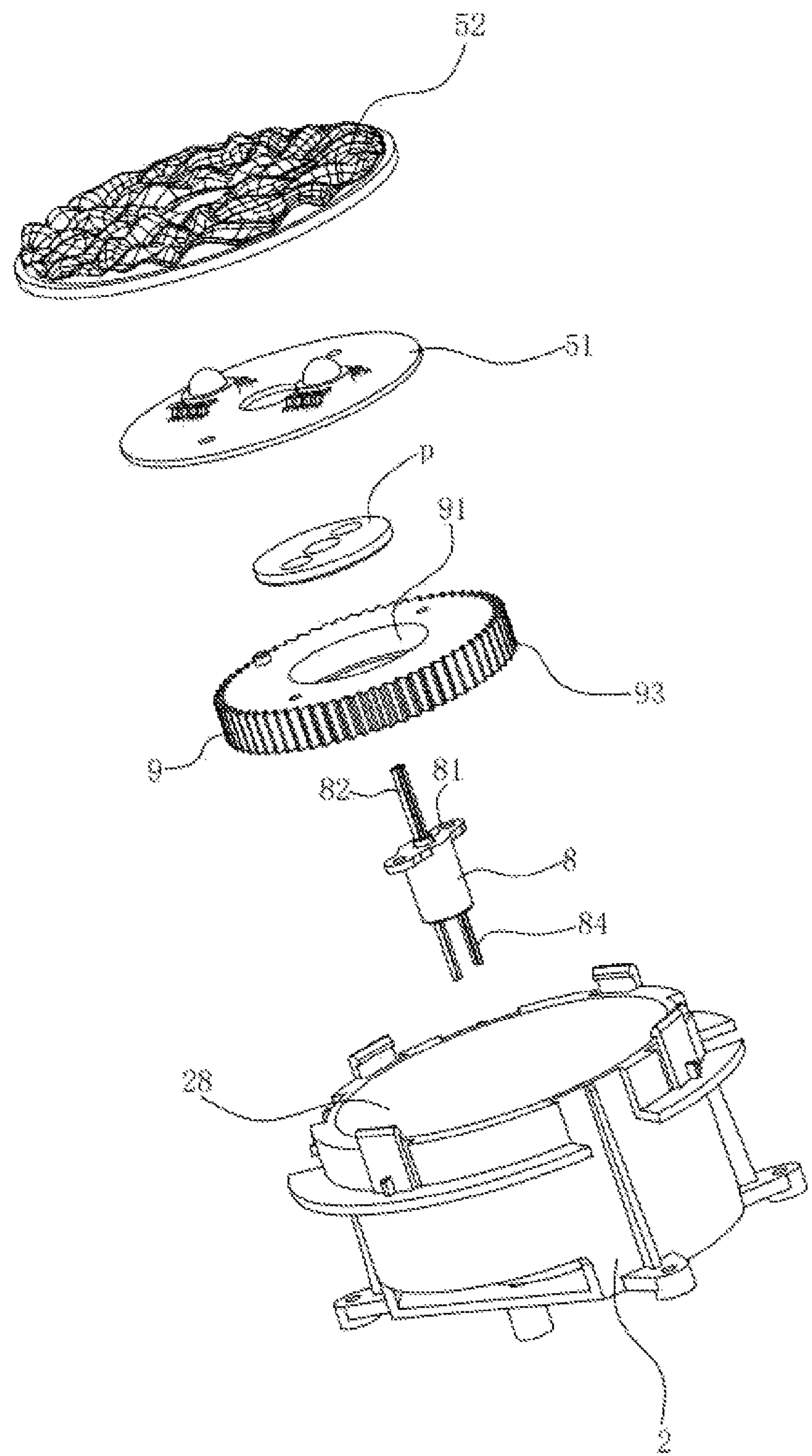
FIG. 18 is a three-dimensional exploded view of FIG. 15.
Figure 19:
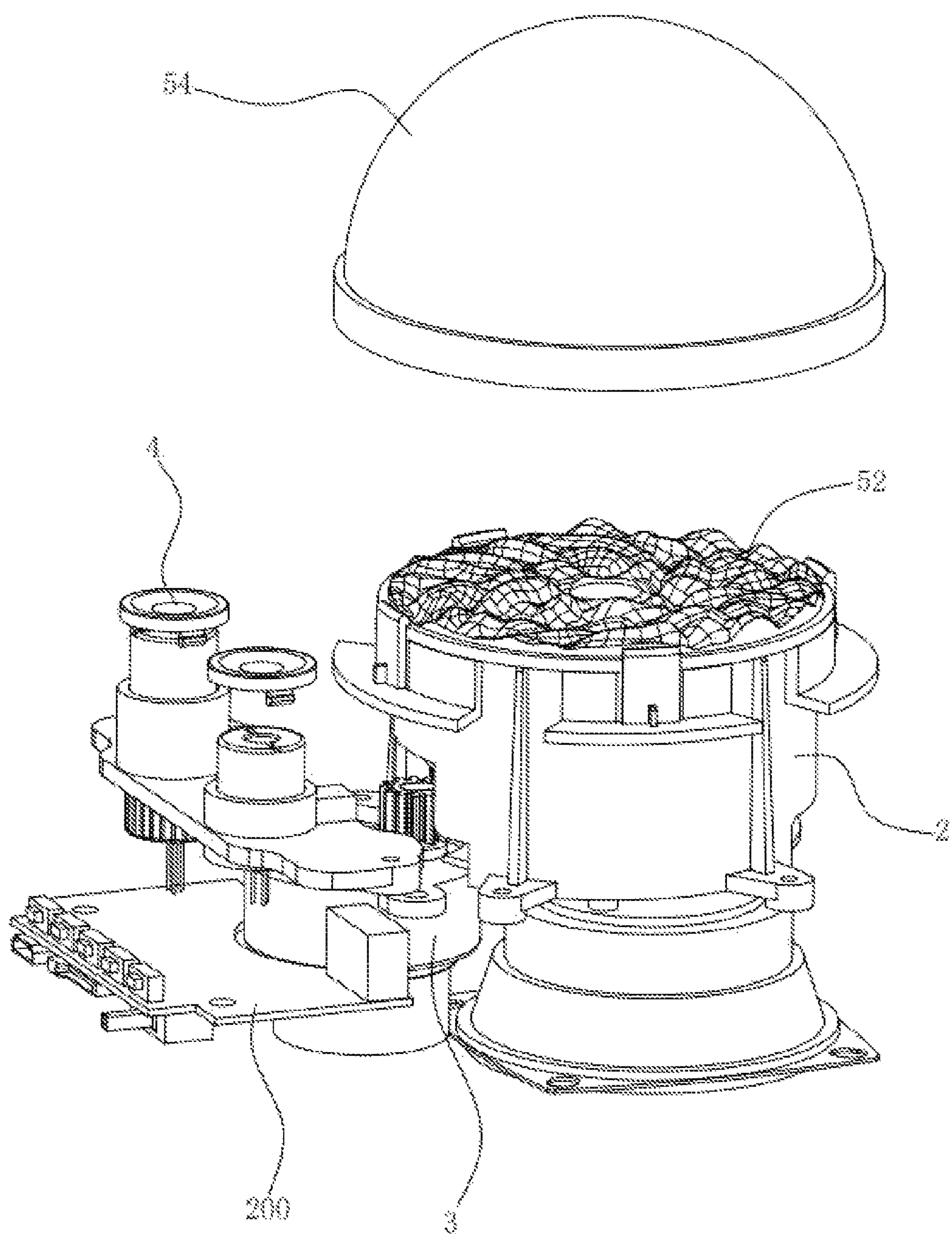
FIG. 19 is a three-dimensional view of a projection apparatus according to a fifth embodiment of the present invention.
Figure 20:
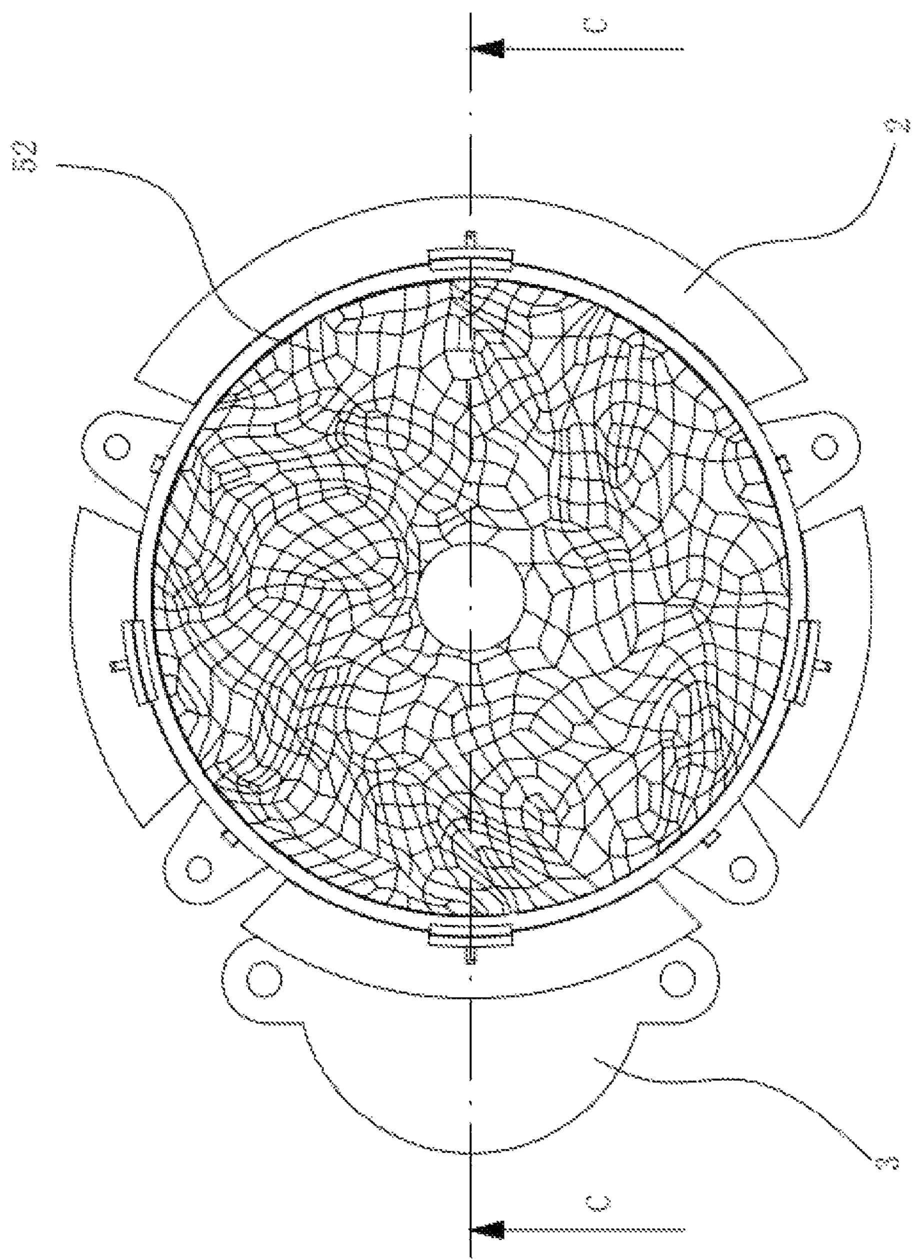
FIG. 20 is a top view of FIG. 19.
Figure 21:
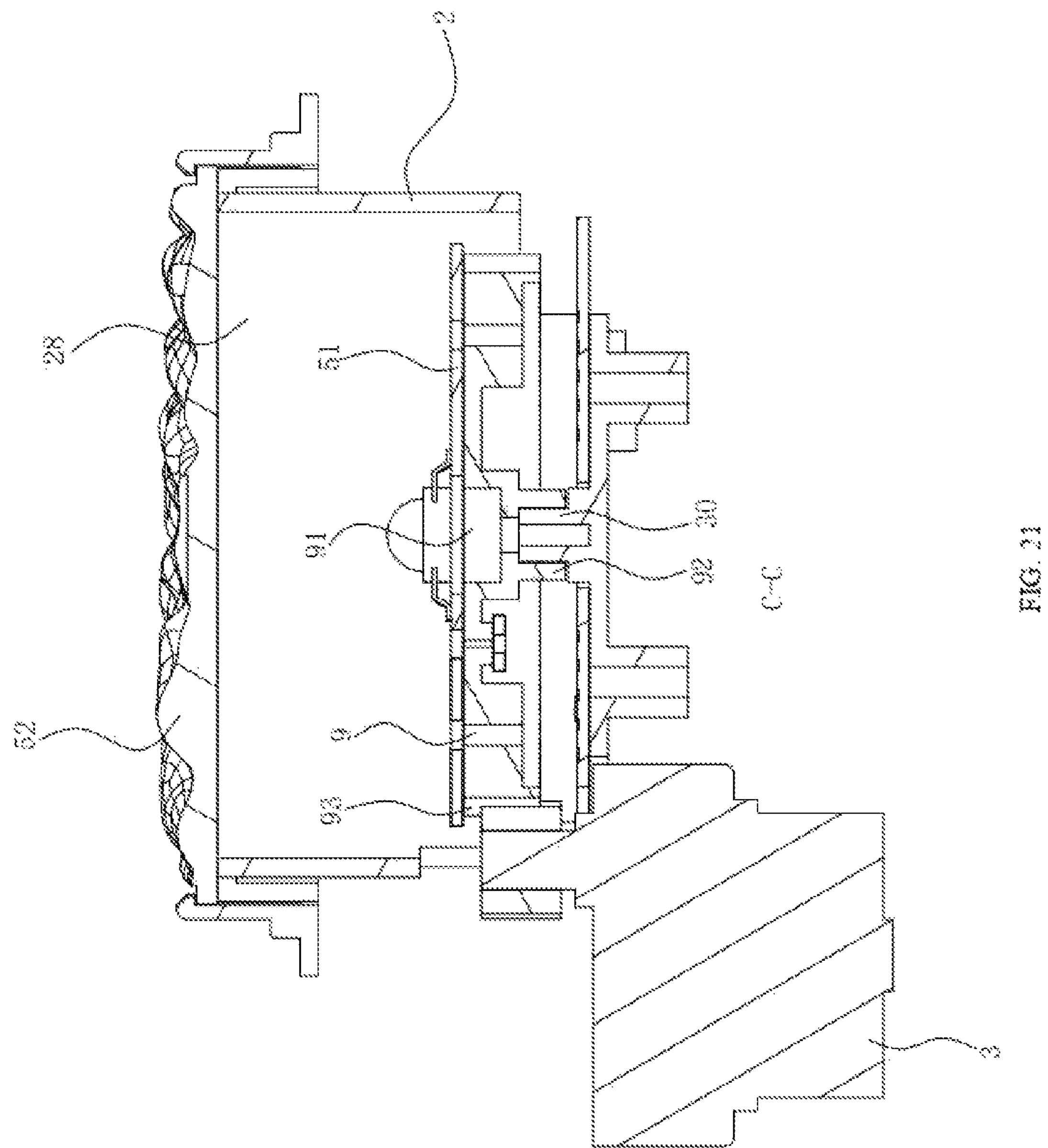
FIG. 21 is a sectional view of sectioning along a line C-C in FIG. 20.
Figure 22:
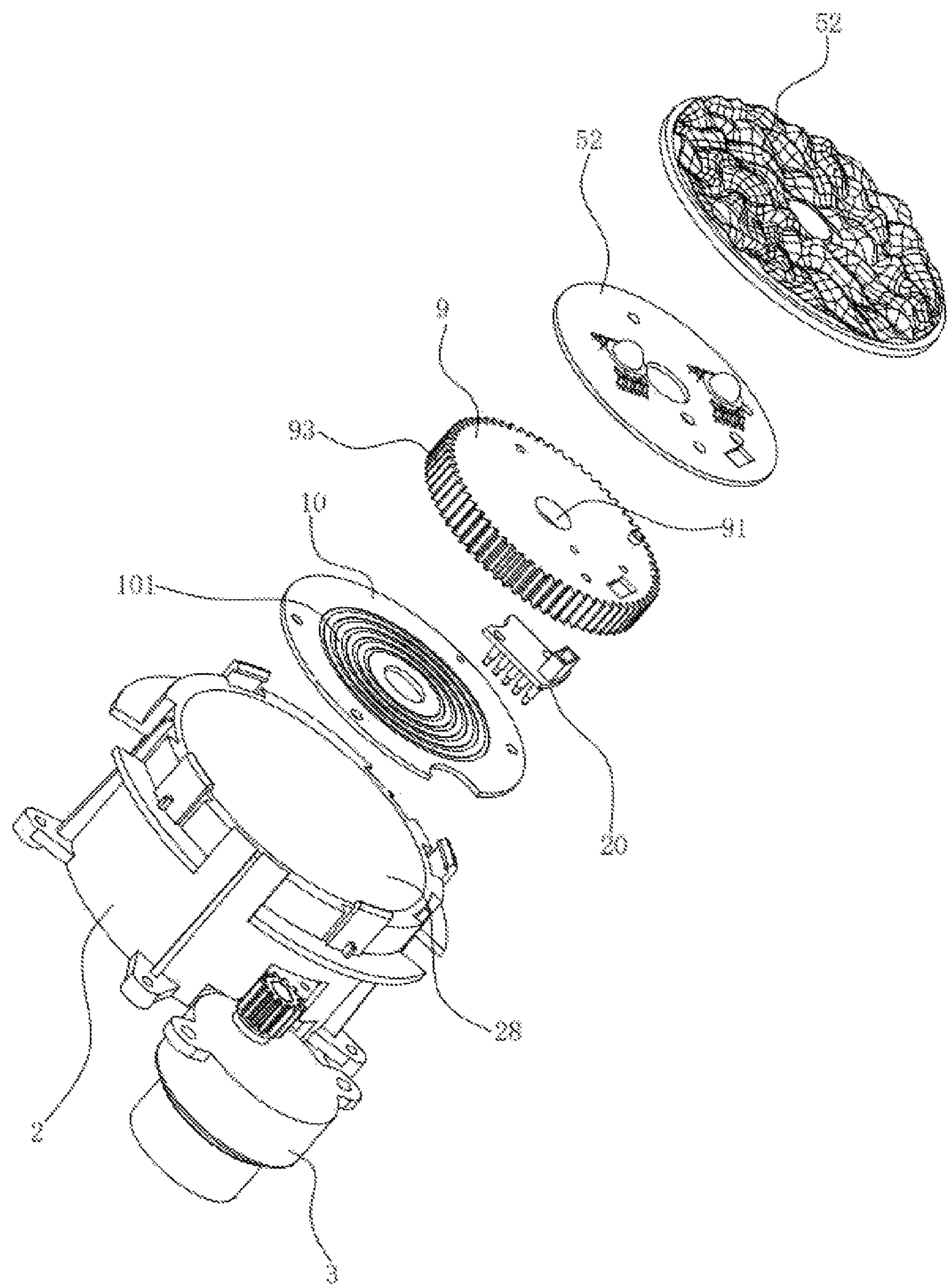
FIG. 22 is a three-dimensional exploded view of FIG. 19.

As shown in FIG. 13 to FIG. 14, each of which is a third embodiment of the present invention, the projection apparatus 100 has the same structure as the housing 1 in the first embodiment, and other structures are roughly the same. The difference is that the base 2 includes a receding groove 26 penetrating through upper and lower surfaces thereof and crimping portions 27 located on left and right sides of the receding groove 26. Each crimping portion 27 includes a crimping hole 271 penetrating through a surface thereof. One of the crimping holes 271 is aligned with the light transmission groove 112 in an up-down manner, and the other of the crimping holes 271 is aligned with the projection port 113 in an up-down manner. The receding groove 26 is aligned with the projection groove 111 in an up-down manner. The motor assembly 3 protrudes upward into the receding groove 26. The first light source assembly 4 is arranged corresponding to the light transmission groove 112 and includes a heat sink 41, a first light source body 42 mounted on the hear sink 41, and a diffractive optical element 44 located above the first light source body 42. The first light source body 42 is capable of protruding upward into the limit groove 115. The diffractive optical element 44 is fixedly mounted in the limit groove 115. The limit wall 114 limits the diffractive optical element 44 to shift along the horizontal direction. A downward protrusion height of the limit wall 114 is greater than twice a height of the diffractive optical element 44. The second light source assembly 5 is fixed to the base 2 and protrudes upward into the receding groove 26. The third light source assembly 6 includes a projection film and the convex lens 64 located above the projection film. The convex lens 64 is exposed upward to the projection port 113 and downward to one of the crimping portions 27 corresponding to one of the crimping holes 271, that is upwardly abutted with the convex lens 64, to inhibit downward movement of the convex lens 64, and the other of the crimping portions 27 is upwardly crimped to the first light source assembly 4, to inhibit downward movement of the first light source assembly.

As shown in FIG. 15 to FIG. 18, each of which is a fourth embodiment of the present invention, both the housing 1 and the first light source assembly 4 of the projection apparatus 100 are the same as those of the second embodiment. The difference is that the base 2 includes a receiving space 28 formed by recessing downwards from a top surface thereof. The receding groove 26 penetrates downward through a bottom wall of the receiving space 28. The base 2 further includes positioning columns 29 located on left and right sides of the receding groove 26 and a limit portion 23 arranged around the support columns 24. The projection apparatus 100 includes a conductive slip ring assembly 8 that protrudes into the receding groove 26 and is fixed to the two positioning columns 29. The conductive slip ring assembly includes a rotor 81, a first wire 82 downwardly connected to the rotor 81, a stator 83 arranged around the rotor 81, and a second wire upwardly connected to the stator 83. The stator 83 is fixed to the two positioning columns 29. The projection apparatus 100 further includes a gear ring member 9 movably connected to the base 2. The gear ring member 9 is located above the conductive slip ring assembly 8 and includes a mounting hole 91, a rotary portion 92 arranged around the mounting hole 91, and a teeth portion 93 arranged around the rotary portion 92. The two positioning columns 29 protrude upward into the mounting hole 91. The limit portion 23 is arranged around the rotary portion 92. The motor assembly 3 includes a gear matched with the teeth portion 93. The second light source body 51 is fixed to a top surface of the gear ring member 9. The first wire 82 is electrically connected to the second light source body 51. The second light source body 51 rotates synchronously with the first wire 82. The optical interference plate 52 is mounted on the base 2 and located above the second light source body 51. The projection apparatus 100 further includes a press plate P which is received in the mounting hole 91 and limits excessive upward shift of the gear ring member 9.

As shown in FIG. 19 to FIG. 22, each of which is a fifth embodiment of the present invention, both the housing 1 and the first light source assembly 4 of the projection apparatus 100 are the same as those of the fourth embodiment. The difference is that the base 2 includes a shaft portion 30 formed by extending upward from a bottom wall of the receiving space 28. The gear ring member 9 is movably mounted on the rotary shaft portion 531. The gear ring member 9 includes a rotary portion 92 formed by extending downward and a teeth portion 93 arranged around the rotary portion 92. The rotary shaft is arranged around the shaft portion 30 and is movably arranged relative to the shaft portion 30. The second light source body 51 is fixed to a top surface of the gear ring member 9. The projection apparatus 100 further includes a conductive disc 10 fixed to the base 2 and a spring needle module 20 fixed to the gear ring member 9. The shaft portion 30 passes upward through the conductive disc 10. The conductive disc 10 includes a plurality of conductive chutes 101 arranged around the rotary shaft. The spring needle module 20 passes upward through the gear ring member 9 to be electrically connected to the second light source body 51. The spring needle module 20 rotates circumferentially along the conductive chutes 101. The conductive spring needle rotates synchronously with the gear ring member 9.

In other embodiments, the limit wall may be arranged on the base, that is, the base includes a support frame and a limit wall fastened to the support frame; the support frame is provided with a light guide groove corresponding to the first light source body; the limit wall includes a limit groove penetrating through upper and lower surfaces thereof and a plurality of hooks extending downward around the limit groove; the diffractive optical element is fixed to the limit groove; a downward protrusion height of the limit wall is greater than twice a height of the diffractive optical element; the limit wall limits excessive shift of the diffractive optical element along a horizontal direction; the plurality of hooks are fastened to a groove wall of the light guide groove; and light emitted by the first light source body passes through the light guide groove to reach the diffractive optical element. (not shown in figure)

In conclusion, the projection apparatus according to the present invention has the following beneficial effects:

(1) The housing includes the light transmission groove and the limit wall arranged around the light transmission groove, where the width of the limit groove defined by the limit wall is greater than the width of the light transmission groove; and the first light source assembly is received in the housing and includes the first light source body and the diffractive optical element located above the first light source body, where the diffractive optical element is mounted in the limit groove, and the limit wall limits excessive shift of the diffractive optical element along the horizontal direction, which facilitates mounting of the diffractive optical element and prevents the situation that the product cannot present the projection effect of the first light source assembly due to loss of the diffractive optical element in maintenance.

The above detailed description is only the description of the preferred embodiments of the present invention, but is not limited to the scope of patent of the present invention. Therefore, all equivalent technical changes made by using the specification of this creation and the content of the drawings are included in the scope of patent of this creation.

What is claimed is:

1. A projection apparatus, comprising:

a housing comprising a cavity, a projection groove in up-down communication with the cavity, a light transmission groove, and a limit wall arranged around the light transmission groove, wherein the limit wall protrudes downward into the cavity, and a width of a limit groove defined by the limit wall is greater than a width of the light transmission groove;

a first light source assembly being received in the cavity and comprising a first light source body and a diffractive optical element located above the first light source body, wherein the diffractive optical element is fixedly mounted in the limit groove, a protrusion height of the limit wall is greater than twice a thickness of the diffractive optical element, and the limit wall limits excessive shift of the diffractive optical element along a horizontal direction; and a second light source assembly comprising a second light source body, an optical interference plate located above the second light source body, and a condenser lens located above the optical interference plate, wherein the condenser lens is mounted in the projection groove.

2. The projection apparatus according to claim 1, wherein the first light source assembly comprises a heat sink and a locking fastener mounted on the heat sink, the heat sink comprises a mounting groove and a fixing hole, the first light source body is mounted on the mounting groove, and the locking fastener protrudes into the fixing hole, to fix the first light source body to the heat sink.

3. The projection apparatus according to claim 2, wherein the diffractive optical element comprises a plurality of light transmission microholes, the first light source body emits a beam of light, the beam of light is diffracted by the plurality of light transmission microholes to form a plurality of light spots, and the plurality of light spots are scattered at intervals on a projection effect formed by the second light source assembly.

4. The projection apparatus according to claim 3, wherein the first light source assembly further comprises a fixing element received in the limit groove, the fixing element comprises a through hole in up-down communication with the light transmission groove, and the diffractive optical element is fixed to the fixing element and located between the light transmission groove and the fixing element.

5. The projection apparatus according to claim 4, wherein the first light source body protrudes upward into the limit groove, and the heat sink is located below the limit groove.

6. The projection apparatus according to claim 4, wherein light emitted by the first light source body sequentially passes through the through hole and the light transmission groove.

7. The projection apparatus according to claim 2, wherein light emitted by the first light source body sequentially passes through the limit groove and the light transmission groove.

8. The projection apparatus according to claim 1, wherein the projection apparatus further comprises a plurality of fixing columns fixedly connected to the housing, a motor assembly for driving the optical interference plate to rotate, and a fixing plate fixed to the motor assembly, the optical interference plate is located above the fixing plate, the two fixing columns are located on left and right sides of the motor assembly, and a screw passes through the fixing plate, the motor assembly, and the fixing columns.

9. The projection apparatus according to claim 8, wherein the motor assembly comprises fixing lugs located on left and right sides of the motor assembly, each of the fixing columns comprises a plurality of limit blocks formed by protruding upward, and the plurality of limit blocks are arranged around the fixing lugs.

10. The projection apparatus according to claim 1, wherein the projection apparatus comprises a base fixed to the housing and a gear ring member movably mounted on the base, the second light source body is fixed to a top surface of the gear ring member, and the motor assembly comprises a gear matched with the gear ring member.

11. The projection apparatus according to claim 10, wherein the projection apparatus further comprises a conductive disc mounted on the base and a spring needle module electrically connected to the second light source body, the conductive disc comprises a conductive chute, and the spring needle module moves circumferentially along the conductive chute and is electrically connected to the conductive chute.

12. The projection apparatus according to claim 10, wherein the projection apparatus comprises a conductive slip ring assembly electrically connected to the second light source body, the second light source body comprises a rotor and a first wire for fixing the rotor, and the second light source body rotates synchronously with the rotor.

13. A projection apparatus, comprising:

a housing comprising a cavity, a projection groove in up-down communication with the cavity, a light transmission groove, and a limit wall located below the light transmission groove, wherein the limit wall protrudes downward into the cavity, and a width of a limit groove defined by the limit wall is greater than a width of the light transmission groove;

a first light source assembly being received in the cavity and comprising a first light source body and a diffractive optical element located above the first light source body, wherein the diffractive optical element is mounted in the limit groove, and the limit wall limits excessive shift of the diffractive optical element along a horizontal direction; and a second light source assembly arranged corresponding to the projection groove, wherein a plurality of light spots formed by the first light source assembly are scattered at intervals on a projection effect formed by the second light source assembly.

14. The projection apparatus according to claim 13, wherein the projection apparatus further comprises a third light source assembly received in the cavity, the housing is further provided with a projection port corresponding to the third light source assembly, widths of the light transmission groove, the projection port, and the projection groove increase in sequence, and projection ranges of the light transmission groove, the projection port, and the projection groove are mutually overlapped.

15. The projection apparatus according to claim 13, wherein the projection apparatus comprises a base received in the cavity and a gear ring portion sleeved on an optical interference plate, the gear ring portion is movably mounted on the base, and the projection apparatus further comprises a motor assembly matched with the gear ring portion to drive the optical interference plate to rotate.

16. The projection apparatus according to claim 15, wherein the projection apparatus further comprises a limit plate located above the optical interference plate, the limit plate comprises a light outlet penetrating through upper and lower surfaces of the limit plate, the light outlet is exposed above the optical interference plate, and the limit plate is downwardly connected to the base and limits the gear ring portion to drive the optical interference plate to move up.

17. The projection apparatus according to claim 13, wherein the projection apparatus further comprises a base received in the cavity and a third light source assembly, the base comprises a receding groove penetrating upper and lower surfaces of the base and two crimping portions located on left and right sides of the receding groove, the second light source assembly protrudes upward into the receding groove, one of the crimping portions is crimped to the first light source assembly, and the other of the crimping portions is crimped to the third light source assembly.

18. The projection apparatus according to claim 13, wherein the second light source assembly comprises a condenser lens mounted in the projection groove, the housing is provided with a positioning portion corresponding to the projection groove, and the condenser lens comprises a clamping groove matched with the positioning portion.

19. A projection apparatus, comprising:

a housing comprising a cavity, a projection groove in up-down communication with the cavity, and a light transmission groove;

a base being received in the cavity and comprising a limit wall and a limit groove formed on the limit wall, wherein the limit groove is located below the light transmission groove;

a first light source assembly being received in the cavity and comprising a first light source body and a diffractive optical element located above the first light source body, wherein the diffractive optical element is fixed to the limit groove, a downward protrusion height of the limit wall is greater than twice a height of the diffractive optical element, and the limit wall limits excessive shift of the diffractive optical element along a horizontal direction; and a second light source assembly arranged corresponding to the projection groove.

20. The projection apparatus according to claim 19, wherein the base is provided with a light guide groove corresponding to the first light source body, the limit wall comprises a plurality of hooks formed by extending downward around the limit groove, the plurality of hooks are fastened to a groove wall of the light guide groove, and light emitted by the first light source body passes through the light guide groove to reach the diffractive optical element.

* * * * *